United States Patent [19]

Gemp

[11] 4,167,707
[45] Sep. 11, 1979

[54] SYMMETRICAL DIGITAL PHASE SHIFTER
[75] Inventor: Robert S. Gemp, Williamsville, N.Y.
[73] Assignee: Westinghouse Electric Corp., Pittsburgh, Pa.
[21] Appl. No.: 887,287
[22] Filed: Mar. 16, 1978

Related U.S. Application Data

[62] Division of Ser. No. 774,726, Mar. 7, 1977, Pat. No. 4,131,936.
[51] Int. Cl.² ............................................. H03K 5/15
[52] U.S. Cl. ..................................... 328/55; 328/155
[58] Field of Search ......................... 328/55, 56, 155

[56] References Cited

U.S. PATENT DOCUMENTS

| | | | |
|---|---|---|---|
| 3,500,214 | 3/1970 | Broadhead et al. | 328/55 X |
| 3,626,202 | 12/1971 | Pound | 328/55 X |
| 3,833,854 | 9/1974 | Schonover | 328/155 |

Primary Examiner—John S. Heyman
Attorney, Agent, or Firm—C. M. Lorin

[57] ABSTRACT

A symmetrical phase shifter generates two signals shifted symmetrically from an inputted single signal, using digital delay lines.

2 Claims, 7 Drawing Figures

SYMMETRICAL DIGITAL PHASE SHIFTER

The invention herein described was made in the course of or under a contract or subcontract thereunder with the Department of the Navy.

This is a division of application Ser. No. 774,726 filed Mar. 7, 1977 now U.S. Pat. No. 4,131,936.

BACKGROUND OF THE INVENTION

The present invention relates to phase shifting apparatus in general and more particularly to a symmetrical digital pulse shifter for controllably and symmetrically shifting in two opposite directions an inputted signal.

Digital delay lines are well known, which are used to introduce a phase delay between two signals, in particular between logic signals each having two opposite logical states as a function of time. For instance, U.S. Pat. No. 3,588,707 of R. A. Manship uses a tapped shift register to create a digital time delay of various length.

It is known from U.S. Pat. No. 3,760,280 of M. T. Covington to control the delay of an analog signal in response to a control signal by conversion through a voltage controlled oscillator into a binary signal which is frequency modulated, using a shift register as a delay line, which is actuated by a clock.

It is known from U.S. Pat. No. 3,833,854 of R. W. Schonover to count with a common clock the same number of pulses from two different count references in order to create a phase shift between two digital signals equal to the difference between the two count references.

An object of the present invention is to provide a phase shifter wherein digital technique is used to symmetrically shift two square-wave signals.

Another object of the present invention is to combine delay lines for generating symmetrical phase shifts between digital signals.

An object of the present invention is also to generate controlled symmetrical phase shifts in two digital signals relative to a common time reference by using variable length random access memory devices.

SUMMARY OF THE INVENTION

The invention resides in a phase shifter for generating in relation to an input signal, a right output signal and a left output signal, said right and left output signals being shifted symmetrically in opposite directions by a predetermined same amount relative to the phase of said input signal. The phase shifter comprises: first delay means for delaying said input signal by a time amount equal to a given amount minus said predetermined same amount; second delay means for delaying said input signal by a time amount equal to said predetermined same amount to generate an intermediary signal; third delay means for delaying said intermediary signal by said given amount; said first and second delay means being digital delay means controlled in real time by a common counter and said third delay means being a constant phase shifter device.

The invention also resides in a phase shifter like the aforementioned phase shifter in which at least another input signal is supplied for generating another right output signal and another left output signal shifted symmetrically relative to the phase of said other input signal by an amount equal to said predetermined same amount. In such case, another first delay means is provided for delaying said other input signal by a time amount equal to a given amount minus said predetermined same amount; another second delay means is provided for delaying said other input signal by a time amount equal to said predetermined same amount to generate an additional intermediary signal; and another third delay means is provided for delaying said additional intermediary signal by said given amount. All said first and all said second delay means are digital delay means controlled in real time by a common counter, and all said third delay means are constant phase shifter devices.

In a preferred embodiment of the invention, symmetrical phase shifts are effected on two sets of staggered square waves from a combination of variable length delay lines. The delay lines are of the random-access memory (RAM) type in which variable delay is achieved by controlled shift between the read and write addresses. According to the preferred embodiment, two identical RAM devices are actuated upon under a common clock, but from two different count references while controlling the shifts equally and symmetrically from such two different count references. A constant shift register compensates for such difference in the count references so that a right and a left shift of two fundamental frequency related waves is achieved symmetrically from a common shift reference.

The invention is directly applicable to a harmonic neutralized static AC power supply including N inverter stages for reconstructing a sinusoidal wave at a fundamental frequency as described in copending patent application Ser. No. 774,726 filed Mar. 7, 1977 by applicant. There, right and left channels are used each for shifting two basic time waves related to the output fundamental frequency. Each channel includes a corresponding right, or left, shift register responsive to the associated shifted time waves; and said shift registers control in sequence all of the N inverter stages, thereby to establish a desired output voltage for the reconstructed sinusoidal wave due to the time span between control signals from said right and left shift registers.

DETAILED DESCRIPTION OF THE INVENTION

Figure 1:
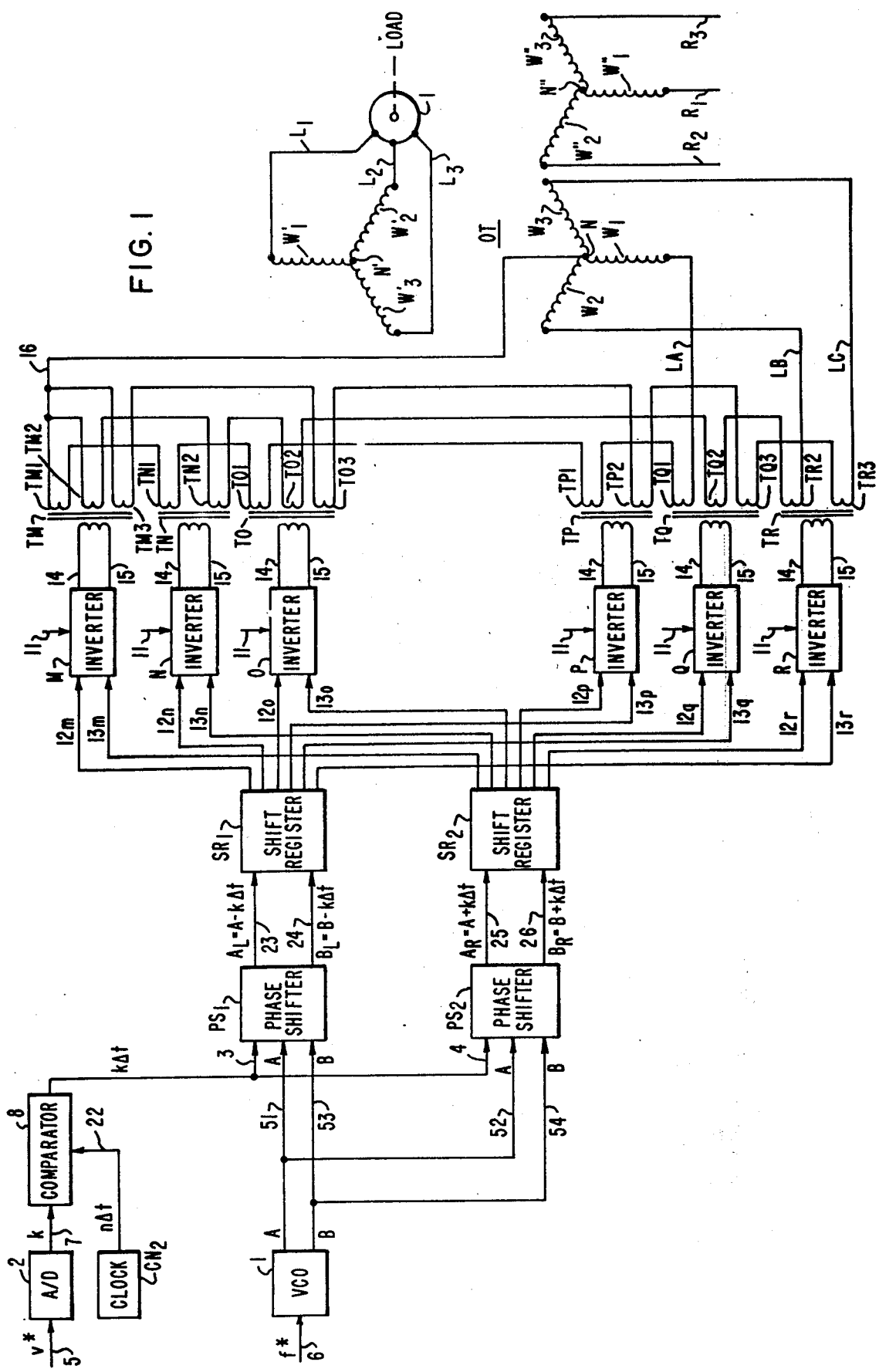
FIG. 1 illustrates the invention in the context of a harmonic neutralization converter system.

Typically, FIG. 1 shows a DC to AC converter using six inverter stages M-R for harmonic neutralization. Each inverter is supplied via line 11 with direct current voltage derived from a rectifier circuit 60 converting the 60 hertz AC power supply into direct current voltage. The inverters are sequentially and cyclically controlled by output signals on lines 12, 13 from respective left and right shift registers $SR_1$, $SR_2$ each including so many lines $12m$ to $12r$ and $13m$ to $13r$, as there are stages. These lines convey at the output from both shift registers sequential signals distributed between the inverters M-R. Shift registers $SR_1$, $SR_2$, together define between paired output lines such as ($12m$, $13m$), a pulse width establishing a period of conduction for the corresponding stage, M-R, of the inverter arrangement.

Figure 2A:
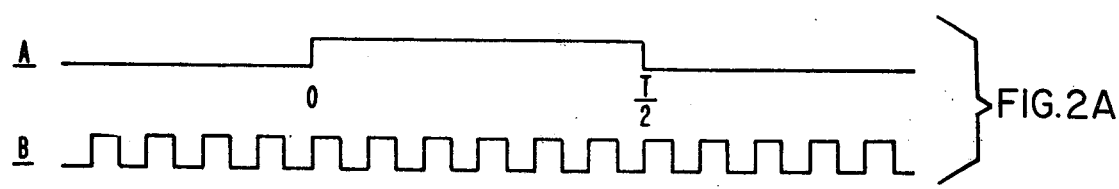
FIG. 2A shows signals A and B used to control two phase shifters, namely, a right and a left phase shifter.

Timing waves characterized by two signals A and B (FIG. 2A) are individually applied to each of two phase shifters $PS_1$, $PS_2$, each individually set by a corresponding one of two shift registers $SR_1$, $SR_2$. As shown in FIG. 2A, signal A is a square pulse and signal B is a square pulse at a frequency multiple of the one of signal A. Signals A and B are conventionally produced by a voltage control oscillator (VCO), as shown in FIG. 1. Phase shifters $PS_1$ and $PS_2$ cause the applied signals A, B to be symmetrically shifted by a given amount. In the case of $PS_1$ the shift is to the left, while through $PS_2$ the shift is to the right. The amount of shift is determined by a control signal $K_t$ applied on lines 3 and 4 to the respective phase shifters $PS_1$, $PS_2$. The control signal $K_t$ is generated by a circuit comprising a digital comparator 8 responsive via line 22 to a counter $CN_2$ and to a digital voltage reference K received on line 7. An analog to digital converter 2 responsive to an analog voltage reference signal v* on line 5 generates signal K. Counter $CN_2$ converts the digital number K into a real time count $K\Delta t$, where $\Delta t$ is the elementary time interval or increment of the counter.

A frequency reference signal f* is applied on line 6 to a VCO, thereby to control the frequency of signals B and A. Signals A and B normally correspond to $K\Delta t=0$. The predetermined amount of shift obtained through $PS_1$ is $-K\Delta t$ for the left side and $+K\Delta t$ through $PS_2$ for the right side. A first set of control signals appears at the left output of $SR_1$ on lines $12m-12r$ which are shifted to the left. A second set of control signals appears at the output of $SR_2$ on lines $13m-13r$ which are shifted to the right. Each inverter is controlled by a single pair of left and right shifted control signals belonging to these two sets.

The phase shifters $PS_1$, $PS_2$ employ the "time phase" type of logic respectively introducing a time lead $-K\Delta t$ and a time lag $+K\Delta t$ for both A and B signals.

Figure 2B:
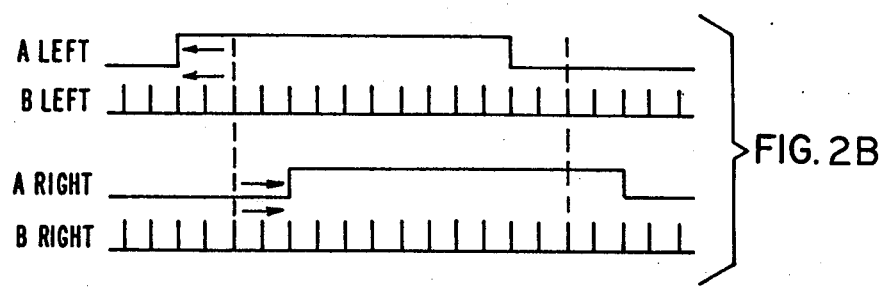
FIG. 2B shows signals A and B with relative shifting to the right and to the left.

Shifting of the two sets of signals A and B symmetrically in time through $SR_1$ and $SR_2$ is as shown by FIG. 1, where $\alpha=K\Delta t$. FIG. 2B shows the relationship of the A and B signals when they are shifted relative to one another in time. The method of shifting signals A and B shown in FIG. 2B has the advantage that synchronism of signals A and B is not affected by shifting, since B is an exact submultiple of A. Therefore, synchronism is automatically achieved for $A_L$ and $B_L$ as well as for $A_R$ and $B_R$.

In FIG. 1 phase shifters $PS_1$ and $PS_2$ are shown to cause shifting of time waves A and B, to the left with $PS_1$ and to the right with $PS_2$ by an amount proportional to K. Actually, a phase shifter can only delay the time wave represented by signal A or B. As will be seen hereinafter by reference to FIGS. 3 and 5, an advance of the time wave is simulated by introducing on both channels a given time delay t from which the $K\Delta t$ shift is counted in two opposite directions, in one channel by subtraction from such reference count, in the other channel by addition to such reference count.

Figure 3:
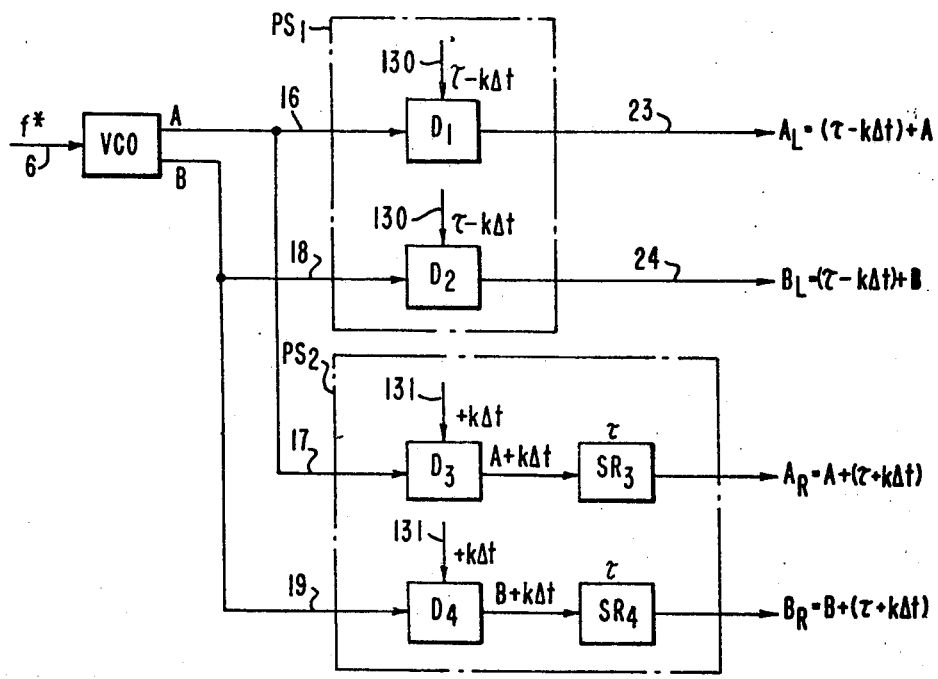
FIG. 3 schematically illustrates the use of variable length delay lines to generate symmetrically shifted pairs of signals A and B.

Referring to FIG. 3, signals A and B obtained from the VCO are applied to a pair of delay lines in each channel, $D_1$ and $D_2$ for $PS_1$, $D_3$ and $D_4$ for $PS_2$.

$D_1$-$D_4$ are variable length delay lines controlled to establish a desired amount of delay. $D_1$ and $D_2$ are controlled from line 130 by a signal establishing a delay $(\tau-K\Delta t)$ where $\tau$ is the above-mentioned given or reference count. Thus signal A, derived on line 16 from the VCO appears at the output of $D_1$ as a delayed signal $A_L=A+(\tau-K\Delta t)$. It is referred to as a left signal because, relative to the time origin defined by the count reference t, the shift is to the left by the amount $K\Delta t$. In a similar fashion, signal B on line 18 from the VCO experiences, through delay line $D_2$, a delay $\tau-K\Delta t$ so that $B_L=B+(\tau-K\Delta t)$. Considering now the right channel, variable length delay lines $D_3$ and $D_4$ are controlled from line 31 so as to effect merely a delay $K\Delta t$. As a result, signal A on line 17 to $D_3$ is delayed to provide at the output a signal $A+K\Delta t$. Also, $D_4$ responds to the B signal on line 19 to pass $B+K\Delta t$.

Phase shifter $PS_2$ also includes a shift register $SR_3$ which is responsive to the delayed signal $(A+K\Delta t)$, and a shift register $SR_4$ which is responsive to the delayed signal $(B+K\Delta t)$. If the delays introduced by $SR_3$ and $SR_4$ are both equal to $\tau$, the outputted signals are $A_R=A+(K\Delta t+\tau)$ and $B_R=B+(K\Delta t+\tau)$. It appears that, for the same above-mentioned count reference $\tau$, the shifts are on the one hand, $+K\Delta t$ to the right for signals $A_R$ and $B_R$ on the other hand $-K\Delta t$ to the left for $A_L$ and $B_L$.

Figure 4:
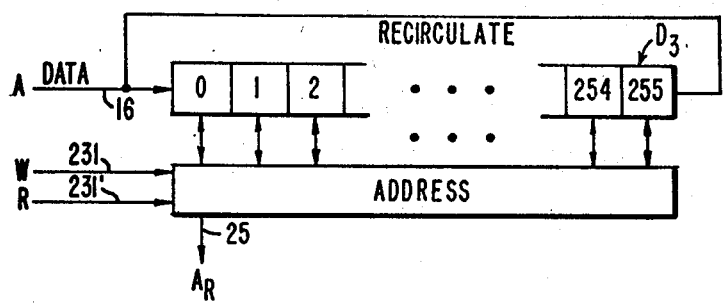
FIG. 4 typically shows a digital memory used as a variable length delay line for the generation of the right shifted signal $A_R$ of FIG. 3.
Figure 5:
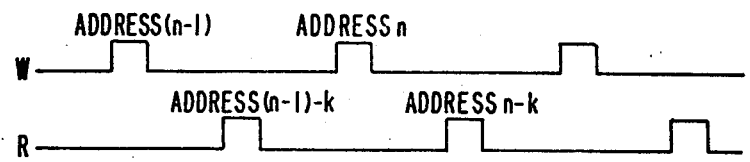
FIG. 5 depicts the write and read signals used to control the amount of delay $\alpha$ between signal A and signal $A_R$ in the example of FIG. 4.

In order to implement digitally the method just described, a novel and unique type of delay line has been conceived. Variable length delay lines $D_1$, $D_2$, $D_3$ and $D_4$ have n steps defined by n locations in a memory each step representing an elementary time interval $\Delta t$ of counter $CN_2$. Signals A and B are stored in digital form into the memory thus achieving a representation of the function inputted on line 16, 17, 18 or 19. The outputted function of line 23, 24, 25 or 26 is derived by reading, with a read signal R, the information out of the memory, with a time delay introduced by selecting address locations which are lagging by so many locations behind the write signal W. Referring to FIG. 4, delay line $D_3$ is illustrated as a memory of 256 locations. Data representing wave A are inputted sequentially over line 16 and stored successively and progressively into all the memory locations, from 0 to 255 under control of a write signal W (FIG. 5) applied on line 231. A read signal R (FIG. 5) is applied on line 231 addressing the locations successively but counting with a lag of so many locations representing in real time the delay $\alpha$ between the locations due to signals W and R (FIG. 5).

From a consideration of FIG. 3, it appears that if $\tau$ is made equal to half of the number of locations n of the delay line, it will be possible to introduce such reference count $(n/2)\Delta t$ without the need of shift registers $SR_3$, $SR_4$. Then, if all delay lines $D_1$-$D_4$ are the same and include 256 locations, $\tau=128$ elementary time intervals $\Delta t$. The first reading location of A in $D_1$ will be obtained by addressing $D_1$ to location 128 minus $K\Delta t$, thus so many locations therefrom toward the first storing location (to the left). On the other hand, the first reading location of A in $D_3$ will be obtained by addressing $D_3$ to location 128 plus $K\Delta t$, thus so many locations therefrom toward the furthest storing location (to the right). The same method is used for signal B into $D_2$ and $D_4$.

Figure 6:
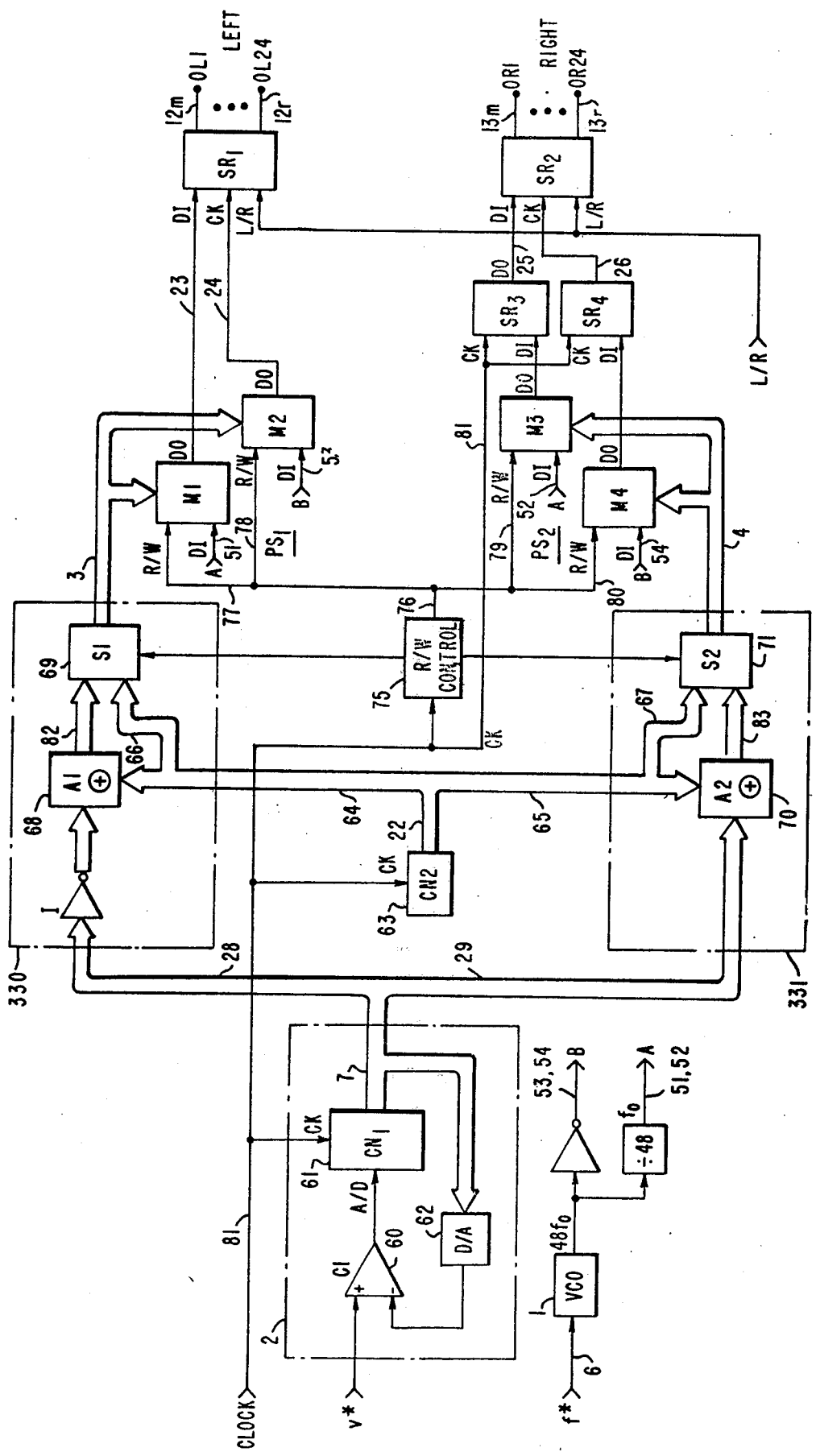
FIG. 6 shows the preferred embodiment of the invention.

For the preferred embodiment of FIG. 6, $\tau$ has been chosen to be the maximum number of locations n in the delay line rather than half of them. Thus, shift registers $SR_3$ and $SR_4$ of n time intervals $\Delta t$ are required. Considering again $D_1$–$D_4$ as identical variable length delay lines such as shown in FIG. 4, the first reading in $D_1$ is effected under $(\tau - K\Delta t)$ at the last location 256, while the first reading in $D_3$ is effected under $+K\Delta t$ at a location counted at $K\Delta t$ from the first location (thus to the right). Shift registers $SR_3$ and $SR_4$ introduce relative to $D_3$ and $D_4$ a constant delay equal to 255 times the elementary time interval $\Delta t$ provided by the clock, thus $\tau$ as delay.

DESCRIPTION OF THE PREFERRED EMBODIMENT

The preferred embodiment of the invention will now be described with particularity by reference to FIG. 6.

Referring to FIG. 6, a control system for a six-stage inverter belonging to a harmonic neutralization arrangement is shown in which, as seen by comparison with the circuit of FIG. 6, left register $SR_1$ and right register $SR_2$ have six stages with corresponding outputs 12m–12r and 13m–13r, respectively. The six output lines from $SR_1$ are applied to the left poles $OL_1$–$OL_6$ of the inverters and similarly the six output lines from $SR_2$ apply the right shift command signals for the various stages to the right poles $OR_1$–$OR_6$. $SR_1$ and $SR_2$ are solid state devices known in the open market as MC14034. For shift register $SR_1$ the $A_L$ signal is applied from line 23 to the data input of the device. The $B_L$ signal is applied on line 24 to the clock input of the device. The same type of connections exist for shift register device $SR_2$ and input signals $A_R$, $B_R$ on lines 25, 26 thereto. For normal inverter output phase sequence, $SR_1$, $SR_2$ are operated in the shift-right mode. If the reverse phase sequence is desired, the left-shift mode of operation is used. Then signals $A_L$ and $A_R$ are inverted and $\bar{A}_L$ and $\bar{A}_R$ are used to provide output polarity reversal and unchanged magnitude of the air-gap flux vector for motor drive applications.

Again, by comparison with FIG. 1, the left phase shifters $PS_1$ and the right phase shifter $PS_2$ are shown in FIG. 6 to include memory devices $M_1$, $M_2$, $M_3$, $M_4$ used as equivalent to delaying devices $D_1$, $D_2$, $D_3$, $D_4$ of FIG. 6. Variable length shift registers of 256 steps are not readily available. However, this function is simulated by a 256 bit random access memory RAM. Memories $M_1$ through $M_4$ may consist of four 256 bit RAM's, or two 512 bit RAM's, or one 1024 bit RAM. In the latter case a standard 2102 MOS memory can be used. It is understood that 256 locations is a matter of choice, and taking a larger or lesser number of steps depends upon the particular design.

$M_1$ and $M_3$ receive on respective input outlines 51, 52 a digital representation of signal A. $M_2$ and $M_4$ receive on respective input lines 52, 54 a digital representation of signal B. Signals A and B are generated in digital form from a common VCO circuit 1 operating at 48 times the fundamental frequency $f_o$ of the sinusoidal wave to be outputted. This frequency is established by reference frequency signal $f^*$ appearing on line 6. Along one channel from the output of the VCO the signal is inverted in order to produce the B signal on lines 53, 54. A divider by 48 yields on a second channel from the same output signal A which appears on lines 51, 52.

Signal A is applied as data to memory devices $M_2$, $M_4$. The read and write signals (R, W) of FIG. 5 are generated by a read-write control circuit 75. The R/W control circuit 75 is a standard generator network for the proper timing of memory read, write and enable lines. The signals outputted therefrom are applied to the four memories $M_1$–$M_4$ via respective lines 77, 78, 79 and 80.

FIG. 6 also shows on the left-hand side a conventional A/D converter circuit used to generate on line 7 digital representations of the analog voltage reference signal $v^*$ of line 5. Circuit 2 includes an 8-bit up-down digital counter $CN_1$, synchronized with a clock from line 81 in order to generate the digital equivalent of signal $v^*$. Circuit 2 also comprises an operational amplifier comparator 60 from which is derived an input determining the count direction of a counter $CN_1$. A feedback loop including a digital to analog converter 62 is established between the digital output of counter $CN_1$ and the negative input of operational amplifier comparator 60 thereby to form an error signal by difference with the reference signal $v^*$ applied at the positive input thereof. This is conventional circuitry.

The circuitry most responsible for the generation of the time delay imposed to the inputted signals A and B of lines 51–54 will now be described in detail.

On line 7, counter $CN_1$ provides a digital count representing signal $v^*$ after the error signal due to the feedback loop has established through amplifier 60 a count level corresponding to the new level of the reference $v^*$. On line 7 a count level representing $v^*$ is established due to the fact that the digital count of $CN_1$ in the A/D converter 2 cannot change faster than the memories $M_1$–$M_4$ can be written into, or read out. Therefore, a count appears on line 7 which is applied on lines 28 and 29. The signal of line 28 is inverted by $I_1$ and applied in this form to a comparator 330. It is observed here that comparator 8 of FIG. 1 breaks down here into two comparators 330 and 331, one for each channel. The signal of line 29 is directly applied to comparator 331. Comparators 330 and 331 include devices 68 and 70 which are conventional adders known in the open market as CD4008, 4-bit, full adders. The count of line 28 is inverted by circuit $I_1$. A free running counter $CN_2$ synchronized with the clock signal on line 81, generates on lines 64 and 65 a digital count representing an accumulated count of elementary time intervals $\Delta t$, $n\Delta t$. Thus, a count $n\Delta t$ is applied to the comparators 330 and 331.

Counter $CN_2$, like counter $CN_1$, is an up-down counter of the type CD4029 but operating in the down mode only. The two adders 68, 70 respectively form, as previously explained, the counts $255\Delta t - K\Delta t$ and $+K\Delta t$. Circuits 330 and 331 also include, at 69 and 71 respectively, selectors $S_1$ and $S_2$ which are used to address the memories either in the writing or in the reading mode as prescribed by the R/W control circuit 75. $S_1$ generates the address to memories $M_1$ and $M_2$, $S_2$ generates the address to memories $M_3$ and $M_4$. Selectors $S_1$ and $S_2$ are preferably solid state devices known on the open market as CD4019. Selector $S_1$ has two inputted digital numbers. One on line 82 from circuit 68 is equal to $n\Delta t + 255\Delta t - K\Delta t$ as used for read addresses. The second on line 66 is the counter $CN_2$ output n t used for write addresses. Similarly, selector $S_2$ has two inputted digital numbers, $+K\Delta t + n\Delta t$ from line 83 and count n t on line 67 directly from counter $CN_2$. The read-write R/W control circuit 75 is a standard sequential network for proper timing of memory read, write and enable lines. It generates the non-concurrent control signals R, W of FIG. 5. Under W, selector S₁ passes the write address n t from line 66 onto lines 3 to memories M₁, M₂. Under R, selector S₁ passes the read address 255Δt−KΔt+nΔt to memories M₁, M₂. The same signals R, W also gate S₂ to pass write address nΔt from line 67, or read address KΔt+nΔt from line 83, onto lines 4 to memories M₃, M₄. It is clear from what has been said earlier that R/W control circuit 75 enables alternate storing and reading of the memories M₁–M₄ to provide a time shift between the representations of A and B, as written under the W signal, and the information read out under the R signal. Therefore, on lines 23 and 24 respective signals A+255Δt−KΔt and B+255Δt−KΔt are generated, while on lines 25, 26 are derived A+KΔt and B+KΔt. The organization just described still leaves a time shift of 255 elementary time intervals Δt between the KΔt counts of the left and right channels. As explained hereinbefore, register SR₃ and SR₄ are provided to compensate for this and establish symmetrical shifts −KΔt and +KΔt from a common origin defined by those 255 elementary time interval delays.

Figure 7:
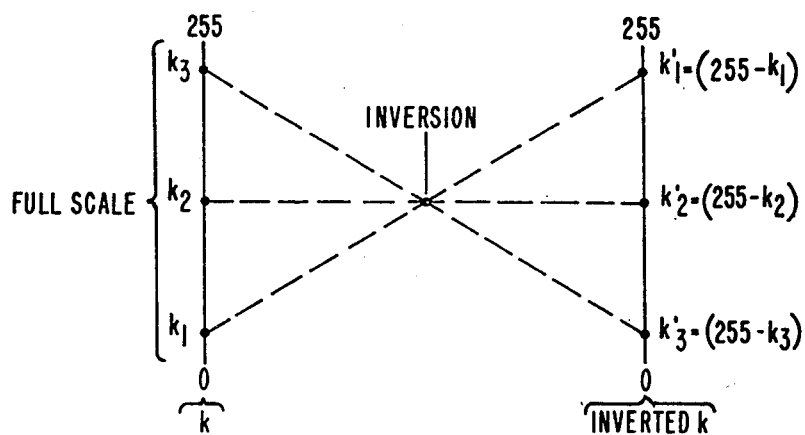
FIG. 7 is a nomograph illustrating the inversion of the binary number controlling the operation of the comparators of FIG. 6.

Referring to FIG. 6, the operation of inverter I₁ can be explained as follows:

From A/D converter 2 is derived on lines 7, 28 and 29 a digital signal K. This digital number is converted by inverter I₁ into (255−K) as can be seen from the nomograph of FIG. 7. The graph represents on two parallel scales the signals of line 29 at the input of adder 70 and of line 28 at the input of adder 68. The inverting function establishes between these two inputs the relation $K' = (255 - K)$ where values K' correspond to line 28 and values K to line 29. Counter CN₂ adds the instantaneous count n t on lines 22 and 64, 65 to values 225−K and K so that at the output of adders 68 and 70 counts (255−K+n)Δt and (K+n)Δt are derived. These are applied respectively to delay lines M₁, M₂ and M₃, M₄ as earlier described.

Shift register SR₃ receives the data output from memory M₃ on line 17 as data input and the clock signal from line 81. The output data on line 25 is the data input for shift register SR₂. Shift register SR₄ receives the data output of memory M₄ and also the clock signal from line 81. The outputted data on line 6 serves as a clock for shift register SR₂. Shift registers SR₃, SR₄ are of fixed length and 256 steps. Two solid state devices known on the open market as MC14562 mounted in series can be used for SR₃ or SR₄. Any number of single chip units can be used as known in the art.

I claim:

1. Symmetrical digital phase shifter for generating in relation to an input signal a right output signal and a left output signal said right and left output signals being shifted symmetrically in opposite directions by a predetermined same amount relative to the phase of said input signal, comprising:

first delay means for delaying said input signal by a time amount equal to a given amount minus said predetermined same amount;

second delay means for delaying said input signal by a time amount equal to said predetermined same amount to generate an intermediary signal;

third delay means for delaying said intermediary signal by said given amount;

said first and second delay means being digital delay means controlled in real time by a common counter, said third delay means being a constant phase shifter device.

2. The symmetrical digital phase shifter of claim 1 with at least another input signal for generating another right output signal and another left output signal shifted symmetrically relative to the phase of said other input signal by an amount equal to said predetermined same amount, comprising:

another first delay means for delaying said other input signal by a time amount equal to a given amount minus said predetermined same amount;

another second delay means for delaying said other input signal by a time amount equal to said predetermined same amount to generate an additional intermediary signal;

another third delay means for delaying said additional intermediary signal by said given amount;

all said first and all said second delay means being digital delay means controlled in real time by a common counter, all said third delay means being constant phase shifter devices.

* * * * *